United States Patent [19]

Yanagiya et al.

[11] Patent Number: 5,610,422

[45] Date of Patent: Mar. 11, 1997

[54] SEMICONDUCTOR DEVICE HAVING A BURIED INSULATED GATE

[75] Inventors: Satoshi Yanagiya; Noboru Matsuda, both of Kawasaki; Yoshiro Baba, Yokohama, all of Japan

[73] Assignee: Kabushiki Kaisha Toshiba, Kawasaki, Japan

[21] Appl. No.: 510,654

[22] Filed: Aug. 3, 1995

[30] Foreign Application Priority Data

Sep. 29, 1994 [JP] Japan .................................. 6-235063

[51] Int. Cl.$^6$ .......................... H01L 29/76; H01L 31/062
[52] U.S. Cl. .......................... 257/330; 257/333; 257/622; 257/750
[58] Field of Search .................................... 257/330, 331, 257/333, 622, 750, 758, 760

[56] References Cited

U.S. PATENT DOCUMENTS 5,392,237   2/1995   Iida ........................................ 257/755

FOREIGN PATENT DOCUMENTS 2-51279   2/1990   Japan .

OTHER PUBLICATIONS

Patent Abstract of JP-2-51279, Feb, 21, 1990, Japan.

*Primary Examiner*—Sara W. Crane
*Assistant Examiner*—David Ostrowski
*Attorney, Agent, or Firm*—Finnegan, Henderson, Farabow, Garrett & Dunner, L.L.P.

[57] ABSTRACT

In a vertical power MOSFET having a U-shaped trench gate and a method of manufacturing the same, a P-type base layer and an N$^+$-type emitter layer are formed on the surface of an N-type semiconductor substrate. A plurality of trenches are formed to such a depth as to reach the semiconductor substrate. After that, an oxide film and a nitride film are formed in this order on the surface of the resultant element and on the inner surfaces of the trenches. In this case, the oxide film and nitride film are each formed to have a thickness corresponding to the operating characteristics of the element at the stage of design. The nitride film of a gate wiring region is selectively removed to form an oxide film on the surface of the element. Consequently, a thick gate insulation film of the oxide films can be formed between the corner portions of the N$^+$-type emitter layer and a gate electrode wiring layer of the gate wiring region which is to be formed afterward, and the gate-to-source breakdown voltage can be enhanced.

5 Claims, 4 Drawing Sheets

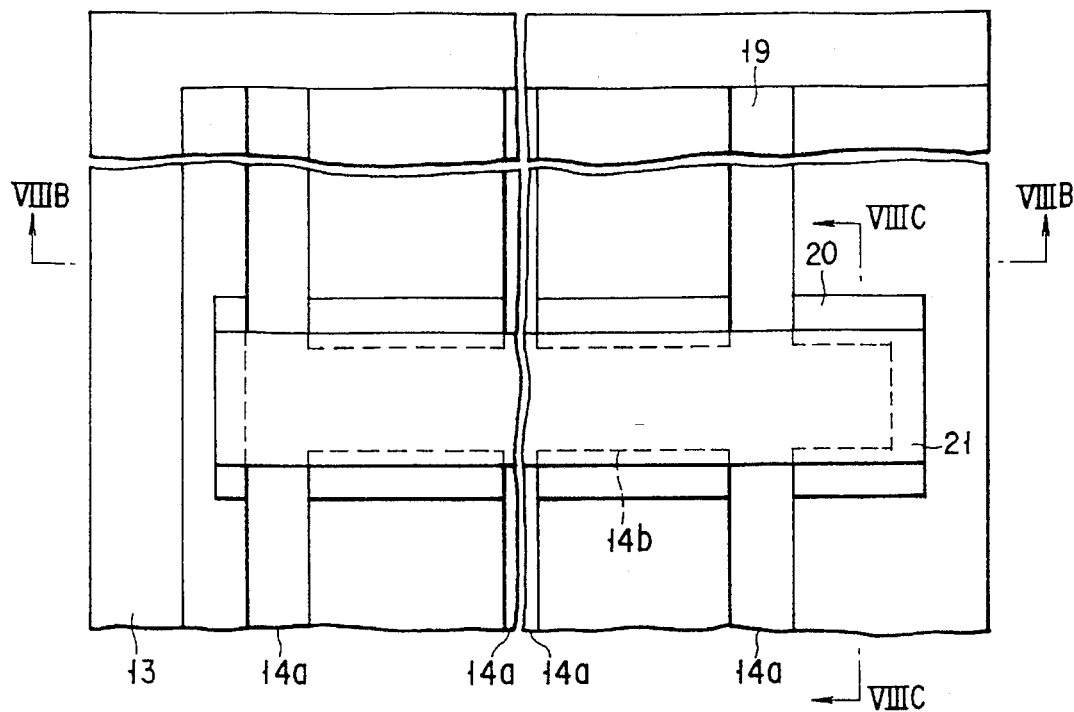
F I G. 8A
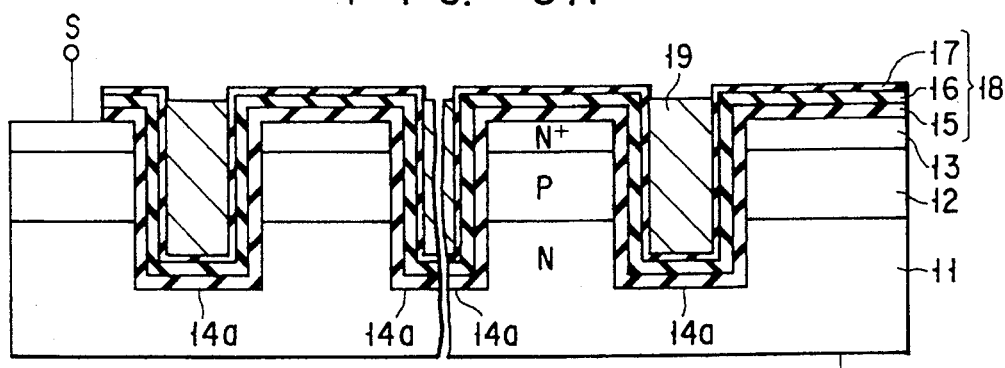
F I G. 8B
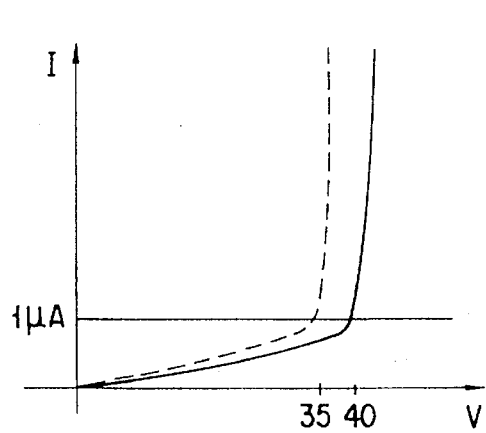
F I G. 7
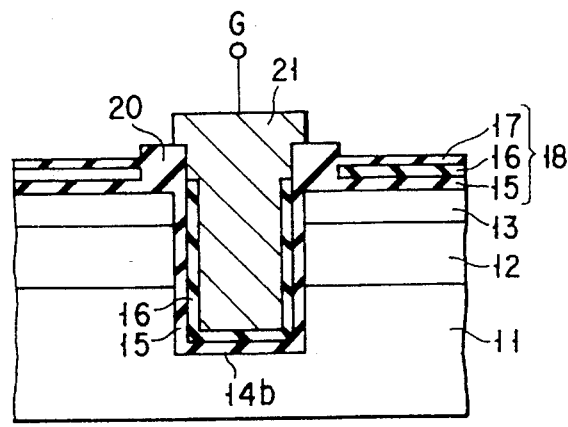
F I G. 8C

SEMICONDUCTOR DEVICE HAVING A BURIED INSULATED GATE

BACKGROUND OF THE INVENTION

1. Field of the Invention

The present invention relates to a semiconductor device having a buried insulated gate and a method of manufacturing the same and, more specifically, to a vertical power MOSFET (metal oxide semiconductor field effect transistor) having a U-shaped trench gate to enhance the breakdown voltage of a gate insulation film between a gate and a source.

2. Description of the Related Art

FIGS. 1A to 1C schematically show the constitution of a conventional vertical power MOSFET having a U-shaped trench gate. Of these figures, FIG. 1A is a plan view of the vertical power MOSFET, FIG. 1B is a cross-sectional view taken along the line IB—IB of FIG. 1A, and FIG. 1C is a cross-sectional view taken along the line IC—IC of FIG. 1A.

As shown in FIGS. 1A to 1C, a P-type base layer 2 is formed on the surface of an N-type semiconductor substrate 1, and an $N^+$-type emitter layer 3 is formed on the layer 2. A plurality of trenches 4a serving to constitute an element operating region (MOS region), are provided in parallel with one another to such a depth as to reach the semiconductor substrate 1 through the base and emitter layers 2 and 3. To connect the trenches 4a one another, a trench 4b serving as a gate wiring region, is formed to cross the trenches 4b at right angles.

Polysilicon serving as a gate 8 is buried in each of the trenches 4a and 4b, while a gate insulation film including an oxide film 5, a nitride film 6 and an oxide film 7 is interposed between the gate 8 and the surfaces of the trenches. A gate electrode wiring layer 9, which is formed from part of the polysilicon buried in the trenches 4a and 4b, extend along the trench 4b.

In the conventional vertical power MOSFET having the above constitution, its surface excluding the gate electrode wiring layer 9 is coated with a protection film (not shown), and a drain electrode D, a source electrode S and a gate electrode G are drawn from the semiconductor substrate 1, $N^+$-type emitter layer 3 and gate electrode wiring layer 9, respectively.

A commonly-known vertical power MOSFET can be operated as a high power device capable of dealing with a large amount of current if the number of gates increases as the number of trenches does.

In the conventional vertical power MOSFET, however, the gate electrode wiring layer 9 covers corner portions of the $N^+$-type emitter layer 3. For this reason, an electric field concentrates upon the corner portions, and the breakdown voltage of the gate insulation film directly under the corner portions drops. Thus, the breakdown voltage of the gate insulation film easily decreases between a gate G and a source S. Though the breakdown voltage can be improved by increasing the thickness thereof, whereas the thickness cannot be increased more than required since the operating characteristics of the device depends upon the thickness of each of the films 5 and 6.

SUMMARY OF THE INVENTION

The object of the present invention is to provide a semiconductor device having a buried insulated gate capable of enhancing the breakdown voltage of a gate insulation film and preventing a failure in isolation between a gate and a source, and a method of manufacturing the semiconductor device.

According to a first aspect of the present invention, there is provided a semiconductor device having a gate electrode constituted by burying an electrode material into a plurality of trenches formed in a surface of a semiconductor substrate, with an insulation film interposed between the electrode material and the trenches, the semiconductor device comprising:

a multilevel film including a first oxide film, a nitride film, and a second oxide film, and formed on the surface of the semiconductor substrate and along a first trench of the plurality of trenches corresponding to an element operating region; and a third oxide film formed at least on the surface of the semiconductor substrate and along a second trench of the plurality of trenches corresponding to a wiring region, the third oxide film being thicker than the multilevel film.

According to a second aspect of the present invention, there is provided a semiconductor device comprising:

a semiconductor substrate of a first conductivity type;

a first semiconductor layer of a second conductivity type formed on a surface of the semiconductor substrate;

a second semiconductor layer of the first conductivity type formed on the first semiconductor layer;

an electrode layer buried into each of a plurality of trenches through the second semiconductor layer and the first semiconductor layer, with an insulation film interposed therebetween, the plurality of trenches being formed to such a depth as to reach the semiconductor substrate;

a wiring layer provided to cover part of the electrode layer; and an oxide film provided at least between the wiring layer and a surface of the second semiconductor layer formed directly thereunder, the oxide film being thicker than the insulation film.

According to a third aspect of the present invention, there is provided a method of manufacturing a semiconductor device having a buried insulated gate, comprising the steps of:

providing a first semiconductor layer of a second conductivity type on a surface of a semiconductor substrate of a first conductivity type;

providing a second semiconductor layer of the first conductivity type on the first semiconductor layer;

forming a plurality of first trenches through the second semiconductor layer and the first semiconductor layer to such a depth as to reach the semiconductor substrate, and then a second trench for connecting the plurality of first trenches to one another;

depositing a first oxide film on a surface of the semiconductor layer as well as on inner surfaces of the plurality of first trenches and the second trench;

depositing a nitride film on the first oxide film;

selectively removing the nitride film to expose the first oxide film formed along the inner surface of the second trench;

growing a second oxide film on the nitride film and the first oxide film;

depositing an electrode material in the first and second trenches, with the second oxide film interposed therebetween; and removing part of the electrode material to leave the electrode material only in the plurality of first trenches and leave the electrode material both in and on the second trench.

According to a fourth aspect of the present invention, there is provided a method of manufacturing a semiconductor device having a buried insulated gate, comprising the steps of:

providing a first semiconductor layer of a second conductivity type on a surface of a semiconductor substrate of a first conductivity type;

providing a second semiconductor layer of the first conductivity type on the first semiconductor layer;

forming a plurality of first trenches through the second semiconductor layer and the first semiconductor layer to such a depth as to reach the semiconductor substrate, and then a second trench for connecting the plurality of first trenches to one another;

depositing a first oxide film on a surface of the semiconductor layer as well as on inner surfaces of the plurality of first trenches and the second trench;

depositing a nitride film on the first oxide film;

depositing an electrode material on the nitride film to fill the first and second trenches;

removing part of the electrode material to leave the electrode material only in the first and second trenches;

selectively removing the nitride film formed along the second trench to expose the first oxide film;

growing a second oxide film on the first oxide film exposed from the nitride film; and forming a wiring layer along the second trench, with the first and second oxide films interposed therebetween.

According to the present invention, only the gate insulation film of the wiring region can be formed thicker than the oxide film. The breakdown voltage of the gate insulation film can thus be increased, without any influence of the gate insulation film upon the operating characteristic of the device.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 7 is a graph showing the gate-to-source breakdown voltage of the vertical power MOSFET of the present invention and that of the prior art vertical power MOSFET; and FIGS. 8A to 8C are schematic views of a vertical power MOSFET having a U-shaped trench gate according to another embodiment of the present invention.

DETAILED DESCRIPTION OF THE PREFERRED EMBODIMENTS

Embodiments of the present invention will now be described with reference to the accompanying drawings.

Figure 1A:
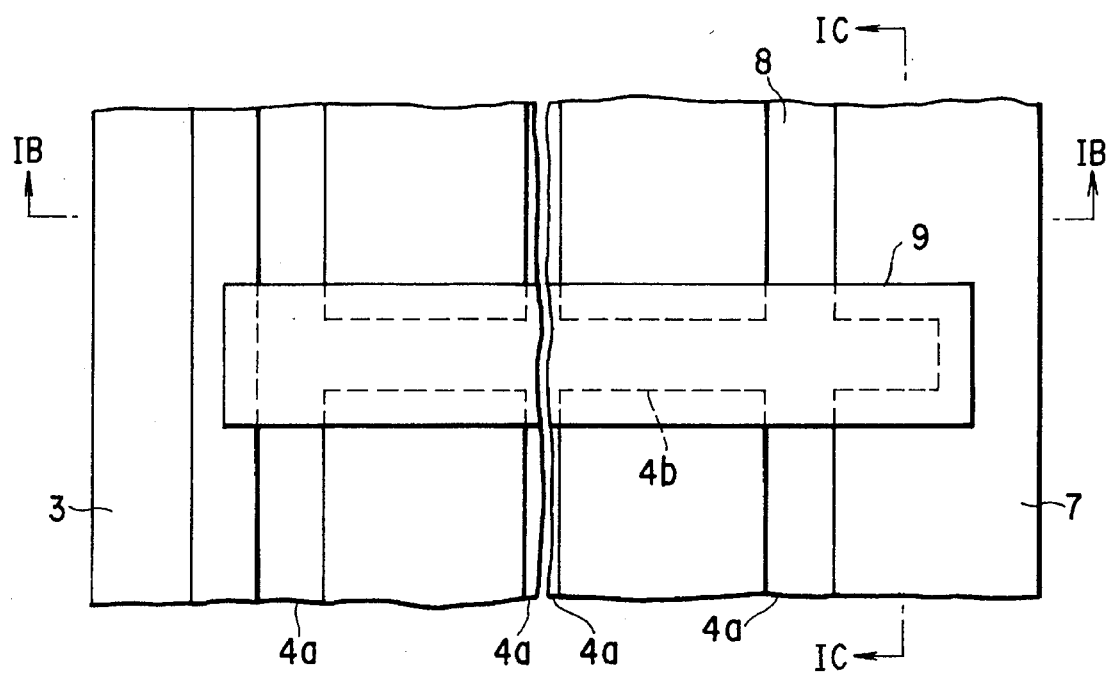
FIGS. 1A to 1C are schematic views of a prior art vertical power MOSFET having a U-shaped trench gate, for explaining the problems thereof.
Figure 1B:
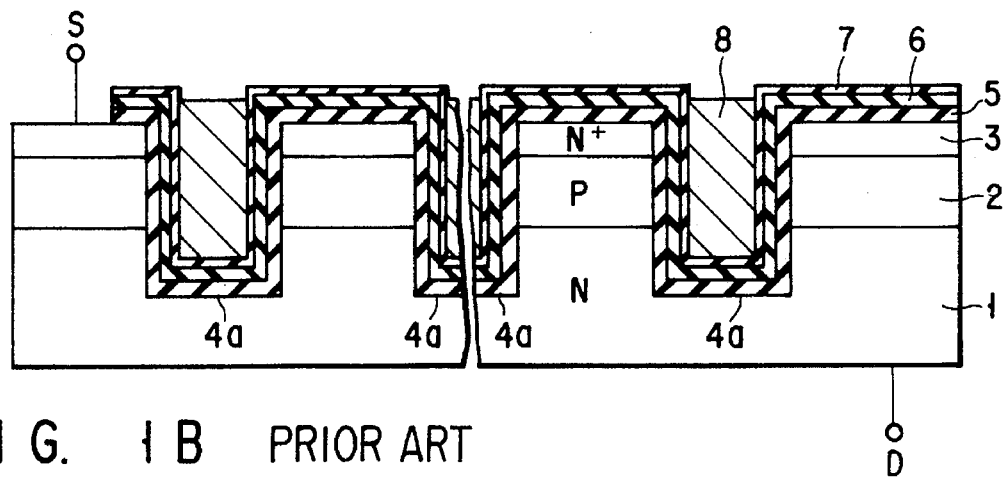
Figure 1C:
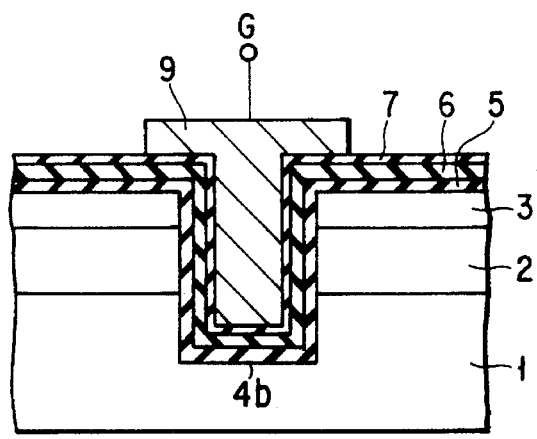
Figure 2A:
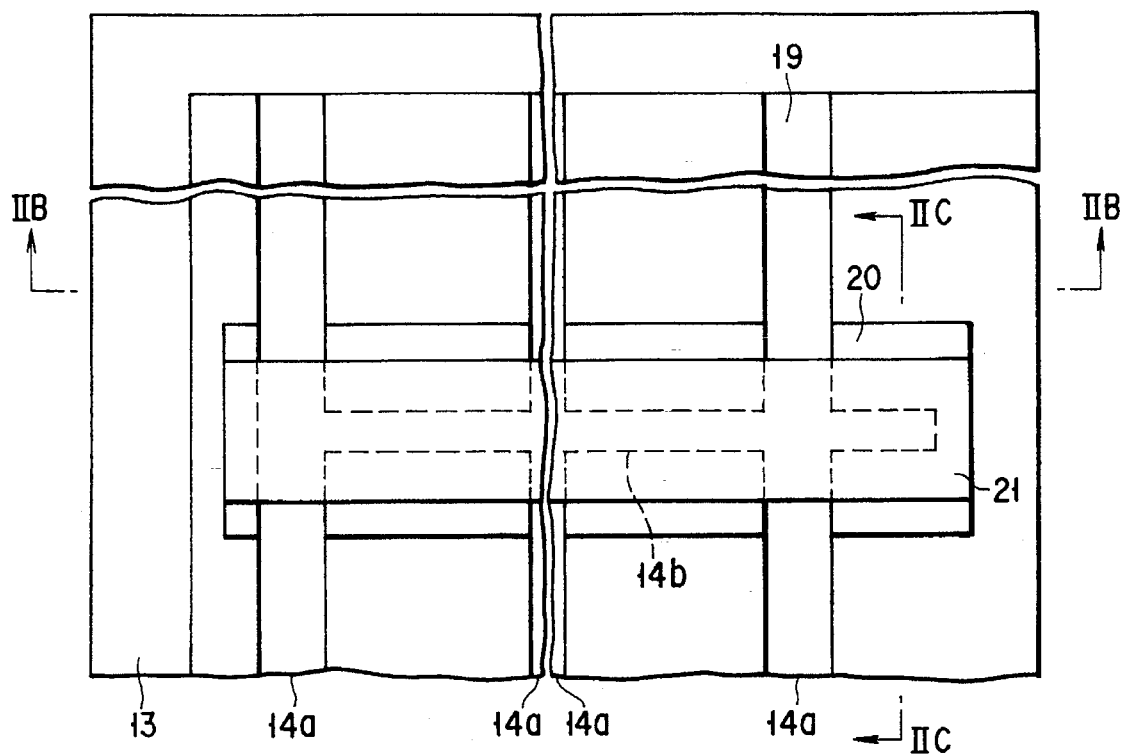
FIGS. 2A to 2C are schematic views of a vertical power MOSFET having a U-shaped trench gate according to an embodiment of the present invention.
Figure 2B:
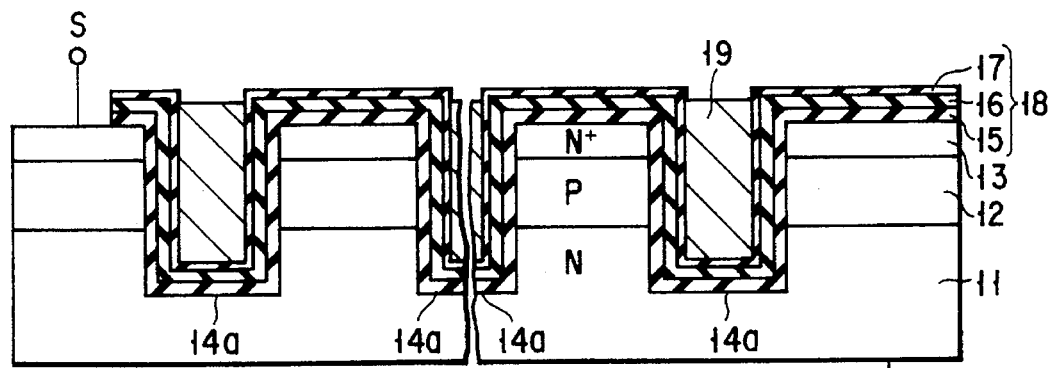
Figure 2C:
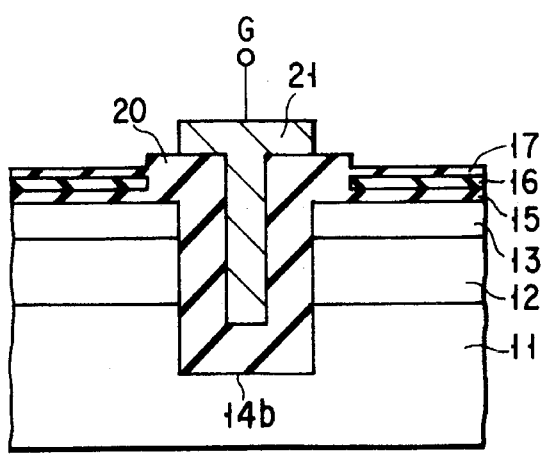

FIGS. 2A to 2C schematically show the constitution of a vertical power MOSFET having a U-shaped trench gate according to an embodiment of the present invention. Of these figures, FIG. 2A is a plan view of the vertical power MOSFET, FIG. 2B is a cross-sectional view taken along the line IIB—IIB of FIG. 2A, and FIG. 2C is a cross-sectional view taken along the line IIC—IIC of FIG. 2A.

As shown in FIGS. 2A to 2C, a P-type base layer (first semiconductor layer) 12 is formed on the surface of an N-type semiconductor substrate 11, and an $N^+$-type emitter layer (second semiconductor layer) 13 is formed on the layer 12. A plurality of trenches 14a and 14b are provided to such a depth as to reach the semiconductor substrate 11 through the base and emitter layers 12 and 13. The trenches 14a are arranged in parallel with one another to constitute an element operating region (MOS region). In this element operating region, polysilicon is buried in each of the trenches 14a, while a gate insulation film (multilevel film) 18 including an oxide film 15, a nitride film 16 and an oxide film 17 is interposed between the gate insulation film 18 and the inner surface of the trench, thus forming a gate 19. If the gate 19 increases in number as the trenches 14a in the element operating region does, a larger amount of current can be processed by the vertical power MOSFET.

The trench 14b crosses each of the trenches 14a to connect the trenches 14a one another. The trench 14b constitutes a gate wiring region from which the gate 19 is taken out. In this gate wiring region, polysilicon is buried into the trench 14b through a gate insulation film 20 consisting of an oxide film, and a gate electrode wiring layer 21 is formed from that part of the polysilicon which remains on the surface of the trench 14b. The layer 21 extends along the trench 14b.

In the vertical power MOSFET having the foregoing constitution, the surface of the device, excluding the gate electrode wiring layer 21, is coated with a protection film (not shown), and a drain electrode D, a source electrode S, and a gate electrode G are drawn from their respective one-sided ends of the semiconductor substrate 11, $N^+$-type emitter layer 13 and gate electrode wiring layer 21.

The vertical power MOSFET is provided with a diffusion layer so as to surround the outermost portion of each of the trenches 14a and 14b, though it is omitted for convenience's sake. The diffusion layer prevents a depletion layer from expanding from the trench.

A process of manufacturing the above vertical power MOSFET will now be described with reference to FIGS. 3A to 6B. These figures are cross-sectional views depicting part of the element operating region and that of the gate wiring region.

First a P-type base layer 12 is formed on the surface of a semiconductor substrate 11 of an N-type silicon wafer by boron implantation and diffusion, and then an $N^+$-type emitter layer 13 is formed on the P-type base layer 12 by arsenic implantation and diffusion. After that, a plurality of trenches 14a and 14b are formed to such a depth as to reach the semiconductor substrate 11 through the base and emitter layers 12 and 13 by selective etching of Si RIE (Reactive Ion Etching).

Figures 3A, 3B:
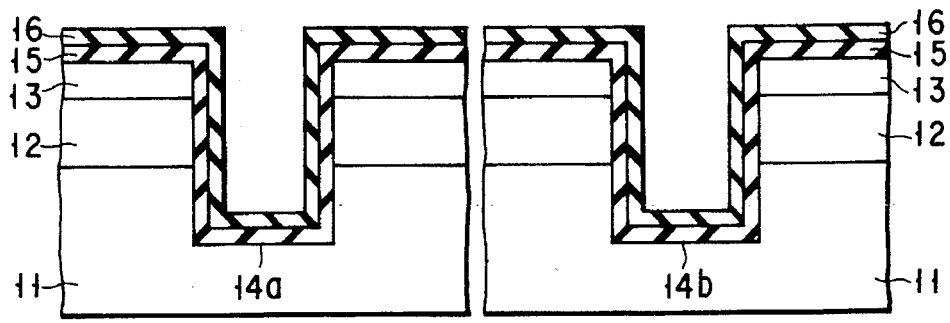
FIGS. 3A and 3B are cross-sectional views schematically showing the main part of the vertical power MOSFET of FIGS. 2A to 2C, for explaining the manufacturing process thereof.

By oxidation and low-pressure SiN CVD (Chemical Vapor Deposition), an oxide film 15 and a nitride film 16 are formed in this order on the $N^+$-type emitter layer 13 and on the inner surface of the trench 14a in the element operating region shown in FIG. 3A and that of the trench 14b in the gate wiring region shown in FIG. 3B. The thickness of the oxide film 15 and that of the nitride film 16 are set to, for example, 50 nm and 20 nm, respectively in accordance with the operating characteristics of the device at the stage of design.

Figures 4A, 4B:
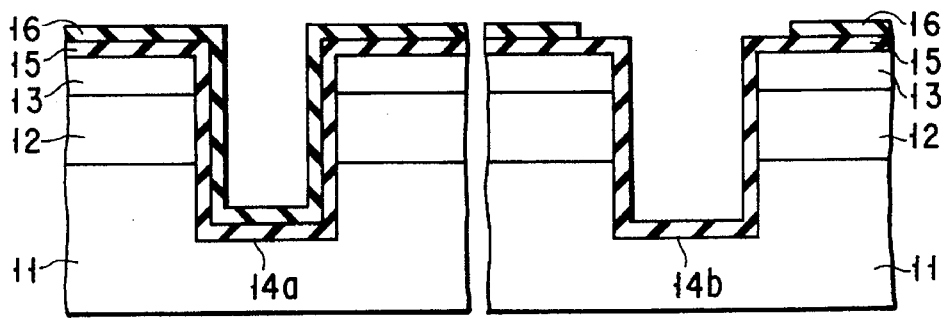
FIGS. 4A and 4B are cross-sectional views schematically showing the main part of the vertical power MOSFET of FIGS. 2A to 2C, for explaining the manufacturing process thereof.

The nitride film 16 is selectively removed by the selective etching of RIE. In the element operating region as shown in FIG. 4A, the nitride film 16 remains as it is. In contrast, in the gate wiring region as shown in FIG. 4B, it is removed, and the oxide film 15 formed thereunder is exposed.

Figures 5A, 5B:
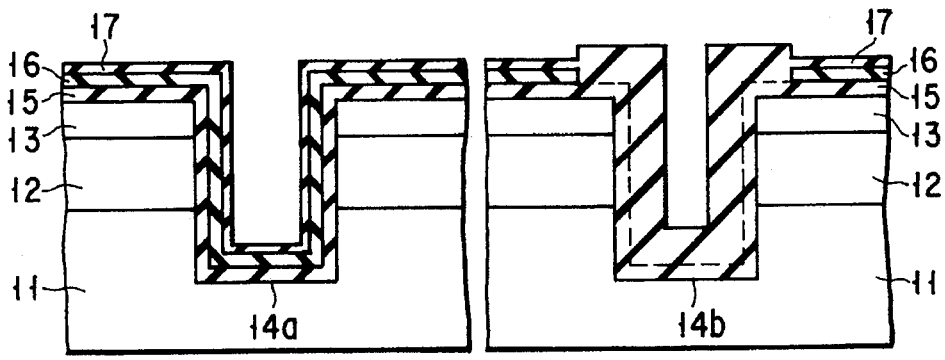
FIGS. 5A and 5B are cross-sectional views schematically showing the main part of the vertical power MOSFET of FIGS. 2A to 2C, for explaining the manufacturing process thereof.

The oxidation is performed again to form an oxide film 17 on the nitride film 16 and on the inner surface of the trench 14b from which the nitride film 16 is removed. In the gate wiring region, as shown in FIG. 5B, the oxide film 17 is formed such that a gate insulation film 20 having a thickness of about 200 nm can be formed. In the element operating region, as shown in FIG. 5A, it is formed such that a gate insulation film 18 having substantially the same thickness as that of the gate insulation film of the prior art device can be formed.

In other words, the oxide film 17 is sufficiently grown on the oxide film 15 by mutual diffusion, while its growth is suppressed on the nitride film 16. Thus, the thickness of the gate insulation film 20 of the gate wiring region is considerably larger than that of the oxide film 17 of the element operating region.

Figures 6A, 6B:
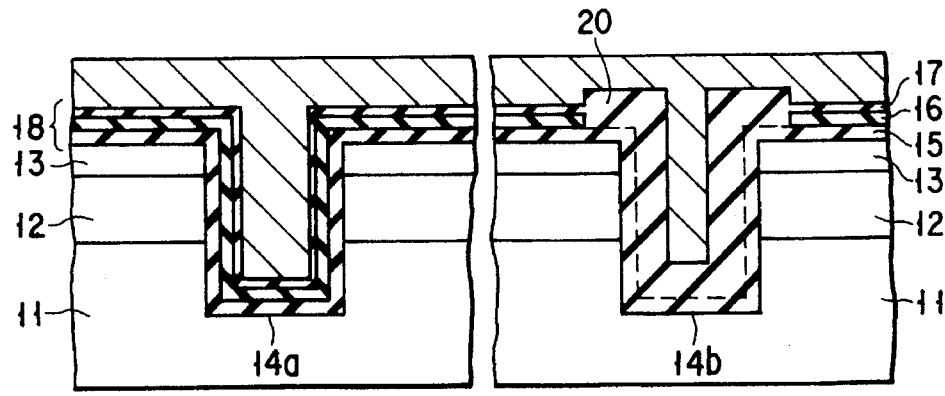
FIGS. 6A and 6B are cross-sectional views schematically showing the main part of the vertical power MOSFET of FIGS. 2A to 2C, for explaining the manufacturing process thereof.

Polysilicon is deposited on the surface of the resultant structure to fill the trenches 14a and 14b of the element operating and gate wiring regions shown in FIGS. 6A and 6B, respectively, and then selectively removed by the selective etching of RIE. As a result, in the element operating region, the polysilicon remains only in the trench 14a to form a gate 19 and, in the gate wiring region, part of the polysilicon remains on the surface of the trench 14b to form a gate electrode wiring layer 21 integrally with the trench 14b.

Even though the gate electrode wiring layer 21 covers the corner portions of the $N^+$-type emitter layer 13, the gate insulation film 20 having a thickness of, e.g., 200 nm, the gate insulation film 20 remains between the N+-type emitter layer 13 and gate electrode wiring layer 21, with the result that the breakdown voltage of the gate insulation film 20 against the concentration of an electric field on the very thick gate insulation film 20, can sufficiently be compensated. Since, furthermore, only the gate insulation film 20 formed under the gate electrode wiring layer 21 is thickened, there is no fear that the operating characteristics of the device is influenced by the thickness of the gate insulation film 20.

A source electrode S is drawn from the $N^+$-type emitter layer 13 through a protection film (not shown) in the element operating region, a gate electrode G is drawn from the gate electrode wiring layer 21 in the gate wiring region, and a drain electrode D is taken out of the undersurface of the substrate 11. Consequently, the vertical power MOSFET having a U-shaped trench gate, as shown in FIGS. 2A to 2C, is completed.

According to the vertical power MOSFET having the foregoing structure, the gate-to-source voltage can be increased to about 40 V when the current of 1 µA flowing between the drain and source leaks, as indicated by the solid line in FIG. 7. In the prior art device, the voltage is about 35 V, as shown by the broken line in the same figure.

As described above, only the gate insulation film formed in the gate wiring region is thickened by the oxide film. In other words, since the gate insulation film formed under the gate wiring layer does not influence the operating characteristics of the device, its breakdown voltage is enhanced by thickening the gate insulation film by the oxide film. It is thus possible to prevent the breakdown voltage of the gate insulation film from decreasing at the corner portions of the $N^+$-type emitter layer covered with the gate electrode wiring layer. Consequently, the insulation between the gate and source can simply be prevented from deteriorating, without any influence of the gate insulation film upon the operating characteristics of the device.

Furthermore, the vertical power MOSFET can be achieved only by adding a step of removing the nitride film in the gate wiring region without any special technique.

The above embodiment is concerned with a vertical power MOSFET wherein a P-type base layer and an $N^+$-type emitter layer are formed on the surface of an N-type semiconductor substrate. The present invention is not limited to this MOSFET, but can be applied to, for example, a vertical power MOSFET having a U-shaped trench gate in which N-type base and $P^+$-type emitter layers are formed on the surface of a P-type semiconductor substrate.

In the above embodiment, the nitride film 16 is all eliminated from the trench 14b in the gate wiring region. However, as shown in FIGS. 8A to 8C, only the parts of the nitride film 16 corresponding to the corner portions of the $N^+$-type emitter layer in the gate wiring region, can be removed, and only the gate insulation film 20 formed immediately under the gate electrode wiring layer 21 can be thickened. In this case, in the gate wiring region, for example, polysilicon is deposited into the trench 14b with oxide and nitride films 15 and 16 interposed therebetween, and then only the nitride film 16 is selectively removed to expose the surface of the oxide film 15. An oxide film 17 is grown on the oxide film 15 to form a gate insulation film 20. After that, polysilicon is deposited again on the surface of the resultant structure to form a gate electrode wiring layer 21 by patterning.

The present invention is not limited to the foregoing vertical power MOSFET, but can be applied to an IGBT (Insulated Gate Bipolar Transistor).

It is needless to say that various changes and modifications can be made without departing from the scope of the subject matter of the present invention.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:

a semiconductor substrate of a first conductivity type;

a first semiconductor layer of a second conductivity type formed on a surface of said semiconductor substrate;

a second semiconductor layer of the first conductivity type formed on said first semiconductor layer;

a first electrode layer buried into each of first trenches of a plurality of trenches, with an insulation film interposed therebetween, said plurality of trenches being formed, through said second semiconductor layer and said first semiconductor layer, to such a depth as to reach said semiconductor substrate, and said first trenches corresponding to a device operation region;

a second electrode layer buried into each of second trenches of said plurality of trenches, with an oxide film interposed therebetween, said second trenches corresponding to a wiring region, and said oxide film being thicker than said insulation film; and a wiring layer formed on said second semiconductor layer with the oxide film interposed therebetween, said wiring layer covering said second electrode layer.

2. The semiconductor device according to claim 1, wherein said first trenches are formed in parallel to one another in the surface of said semiconductor substrate.

3. The semiconductor device according to claim 1, wherein said second trenches are provided to connect said first trenches to one another.

4. The semiconductor device according to claim 1, wherein said wiring layer is formed along said second trenches.

5. The semiconductor device according to claim 1, wherein said insulation film is a multilevel film including a first oxide LAW OFFICES film, a nitride film and a second oxide film.

* * * * *